(12) United States Patent
Li et al.

(10) Patent No.: US 11,160,170 B2
(45) Date of Patent: Oct. 26, 2021

(54) DISPLAY AND ELECTRONIC DEVICE

(71) Applicant: Coretronic Corporation, Hsin-Chu (TW)

(72) Inventors: Xin-Xian Li, Hsin-Chu (TW); Yao-Cheng Lu, Hsin-Chu (TW); Chin-Lung Chen, Hsin-Chu (TW)

(73) Assignee: Coretronic Corporation, Hsin-Chu (TW)

( * ) Notice: Subject to any disclaimer, the term of this patent is extended or adjusted under 35 U.S.C. 154(b) by 80 days.

(21) Appl. No.: 16/721,949

(22) Filed: Dec. 20, 2019

(65) Prior Publication Data

US 2020/0205294 A1 Jun. 25, 2020

(30) Foreign Application Priority Data

Dec. 24, 2018 (CN) .......................... 201822172467.0

(51) Int. Cl.
*H05K 1/00* (2006.01)
*H05K 1/18* (2006.01)
*G02F 1/1345* (2006.01)

(52) U.S. Cl.
CPC ......... *H05K 1/189* (2013.01); *G02F 1/13452* (2013.01); *H05K 2201/10136* (2013.01)

(58) Field of Classification Search
CPC .......... H05K 1/189; H05K 2201/10136; G02F 1/13452

USPC ......................................................... 361/749
See application file for complete search history.

(56) References Cited

U.S. PATENT DOCUMENTS

| 2004/0227716 | A1* | 11/2004 | Lin | ................. | G09G 3/3648 |
| | | | | | 345/99 |
| 2015/0199038 | A1* | 7/2015 | Li | .................... | G06F 1/1643 |
| | | | | | 345/173 |
| 2018/0336813 | A1* | 11/2018 | Li | ................... | G09G 3/2092 |

FOREIGN PATENT DOCUMENTS

TW 594240 6/2004

\* cited by examiner

*Primary Examiner* — Andargie M Aychillhum
(74) *Attorney, Agent, or Firm* — JCIRPNET

(57) ABSTRACT

The invention provides a display and an electronic device. The display includes a first substrate, a second substrate, a display medium layer, and a flexible printed circuit board. The first substrate is an active component array substrate and has a first region and a second region. The second substrate is disposed opposite to the first substrate and faces the first region of the first substrate, wherein the second region of the first substrate is a region of the first substrate extending beyond the second substrate. The display medium layer is disposed between the first substrate and the second substrate and located in the first region. The flexible printed circuit board is disposed in the second region and electrically connected to the first substrate, and an orthographic projection of the flexible printed circuit board on the first substrate is located within the range of the first substrate.

18 Claims, 2 Drawing Sheets

DISPLAY AND ELECTRONIC DEVICE

CROSS-REFERENCE TO RELATED APPLICATION

This application claims the priority benefit of China application serial no. 201822172467.0, filed on Dec. 24, 2018. The entirety of the above-mentioned patent application is hereby incorporated by reference herein and made a part of this specification.

BACKGROUND OF THE INVENTION

1. Field of the Invention

The invention relates to a display and an electronic device, and in particular, to a display that conforms to the trend of thinness, and an electronic device using the display.

2. Description of Related Art

The existing display is mainly composed of an active component array substrate, a display medium layer, an opposite substrate, two polarizers, and a printed circuit board, where the active component array substrate and the printed circuit board are electrically connected through a flexible printed circuit board. That is to say, the flexible printed circuit board is bridged between the active component array substrate and the printed circuit board. In addition, the display may be electrically connected to a system host to define an electronic device. In order to meet the current trend of thin and light electronic products, the display is also designed to be thinner or narrower. The methods include: 1) flat type design: the thickness in a Z direction can be reduced, but the length in a Y direction cannot be reduced; 2) bend type design: the length in the Y direction can be reduced, but the thickness in the Z direction cannot be reduced. That is to say, neither of the above two methods reduces the dimensions in the Y direction and the Z direction at the same time. Therefore, how to effectively reduce the dimensions in the Y direction and the Z direction at the same time has become one of the current goals of the active development of the industry.

The information disclosed in this Background section is only for enhancement of understanding of the background of the described technology and therefore it may contain information that does not form the prior art that is already known to a person of ordinary skill in the art. The information disclosed in the Background section does not mean that the problems to be resolved by one or more embodiments of the invention were acknowledged by a person of ordinary skill in the art.

SUMMARY OF THE INVENTION

The invention provides a display, which replaces a conventional printed circuit board with a flexible printed circuit board, and has the advantages of reducing weight and thickness.

The invention also provides an electronic device, which includes the foregoing display, can conform to the trend of thinness and has a lower manufacturing cost.

Other objectives and advantages of the invention may be further understood from the technical features disclosed in the invention.

In order to achieve one, some, or all of the aforementioned objectives or other objectives, an embodiment of the invention provides a display, including a first substrate, a second substrate, a display medium layer, and a flexible printed circuit board. The first substrate is an active component array substrate and has a first region and a second region. The second substrate is disposed opposite to the first substrate and faces the first region of the first substrate, where the second region of the first substrate is a region of the first substrate extending beyond the second substrate. The display medium layer is disposed between the first substrate and the second substrate and located in the first region of the first substrate. The flexible printed circuit board is disposed in the second region of the first substrate, where the first substrate is electrically connected to the flexible printed circuit board, and an orthographic projection of the flexible printed circuit board on the first substrate is located within the range of the first substrate.

Another embodiment of the invention provides an electronic device, including a display and a system host. The display includes a first substrate, a second substrate, a display medium layer, and a flexible printed circuit board. The first substrate is an active component array substrate and has a first region and a second region. The second substrate is disposed opposite to the first substrate and faces the first region of the first substrate, where the second region of the first substrate is a region of the first substrate extending beyond the second substrate. The display medium layer is disposed between the first substrate and the second substrate and located in the first region of the first substrate. The flexible printed circuit board is disposed in the second region of the first substrate, where the first substrate is electrically connected to the flexible printed circuit board, and an orthographic projection of the flexible printed circuit board on the first substrate is located within the range of the first substrate. The system host is pivotally connected to the display, and electrically connected to the display.

Based on the above, the embodiments of the invention have at least one of the following advantages or effects. In the design of the display of the invention, the orthographic projection of the flexible printed circuit board on the first substrate is within the range of the first substrate. Compared with the prior art in which the flexible printed circuit board is only bridged between the active component array substrate and the printed circuit board, the flexible printed circuit board of the invention is different from the flexible printed circuit board in the prior art in setting, can replace the printed circuit board in the prior art, and has the advantages of reducing the weight of the display and reducing the thickness of the display.

Other objectives, features and advantages of the invention will be further understood from the further technological features disclosed by the embodiments of the invention wherein there are shown and described preferred embodiments of this invention, simply by way of illustration of modes best suited to carry out the invention.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

In the following detailed description of the preferred embodiments, reference is made to the accompanying drawings which form a part hereof, and in which are shown by way of illustration specific embodiments in which the invention may be practiced. In this regard, directional terminology, such as "top," "bottom," "front," "back," etc., is used with reference to the orientation of the Figure(s) being described. The components of the invention can be positioned in a number of different orientations. As such, the directional terminology is used for purposes of illustration and is in no way limiting. On the other hand, the drawings are only schematic and the sizes of components may be exaggerated for clarity. It is to be understood that other embodiments may be utilized and structural changes may be made without departing from the scope of the invention. Also, it is to be understood that the phraseology and terminology used herein are for the purpose of description and should not be regarded as limiting. The use of "including," "comprising," or "having" and variations thereof herein is meant to encompass the items listed thereafter and equivalents thereof as well as additional items. Unless limited otherwise, the terms "connected," "coupled," and "mounted" and variations thereof herein are used broadly and encompass direct and indirect connections, couplings, and mountings. Similarly, the terms "facing," "faces" and variations thereof herein are used broadly and encompass direct and indirect facing, and "adjacent to" and variations thereof herein are used broadly and encompass directly and indirectly "adjacent to". Therefore, the description of "A" component facing "B" component herein may contain the situations that "A" component directly faces "B" component or one or more additional components are between "A" component and "B" component. Also, the description of "A" component "adjacent to" "B" component herein may contain the situations that "A" component is directly "adjacent to" "B" component or one or more additional components are between "A" component and "B" component. Accordingly, the drawings and descriptions will be regarded as illustrative in nature and not as restrictive.

Figure 1:
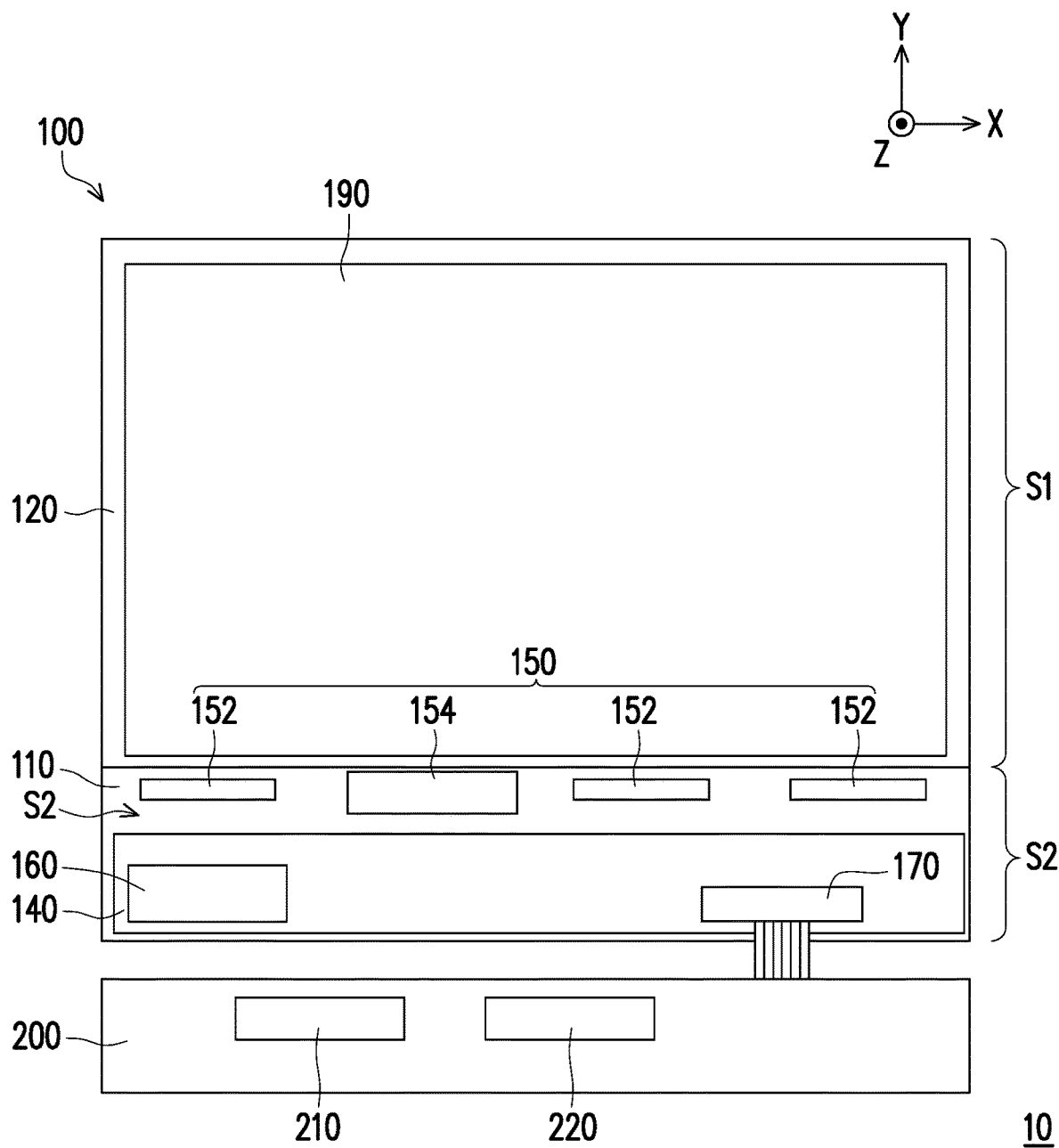
FIG. 1 is a schematic top view of an electronic device according to the invention.
Figure 2:
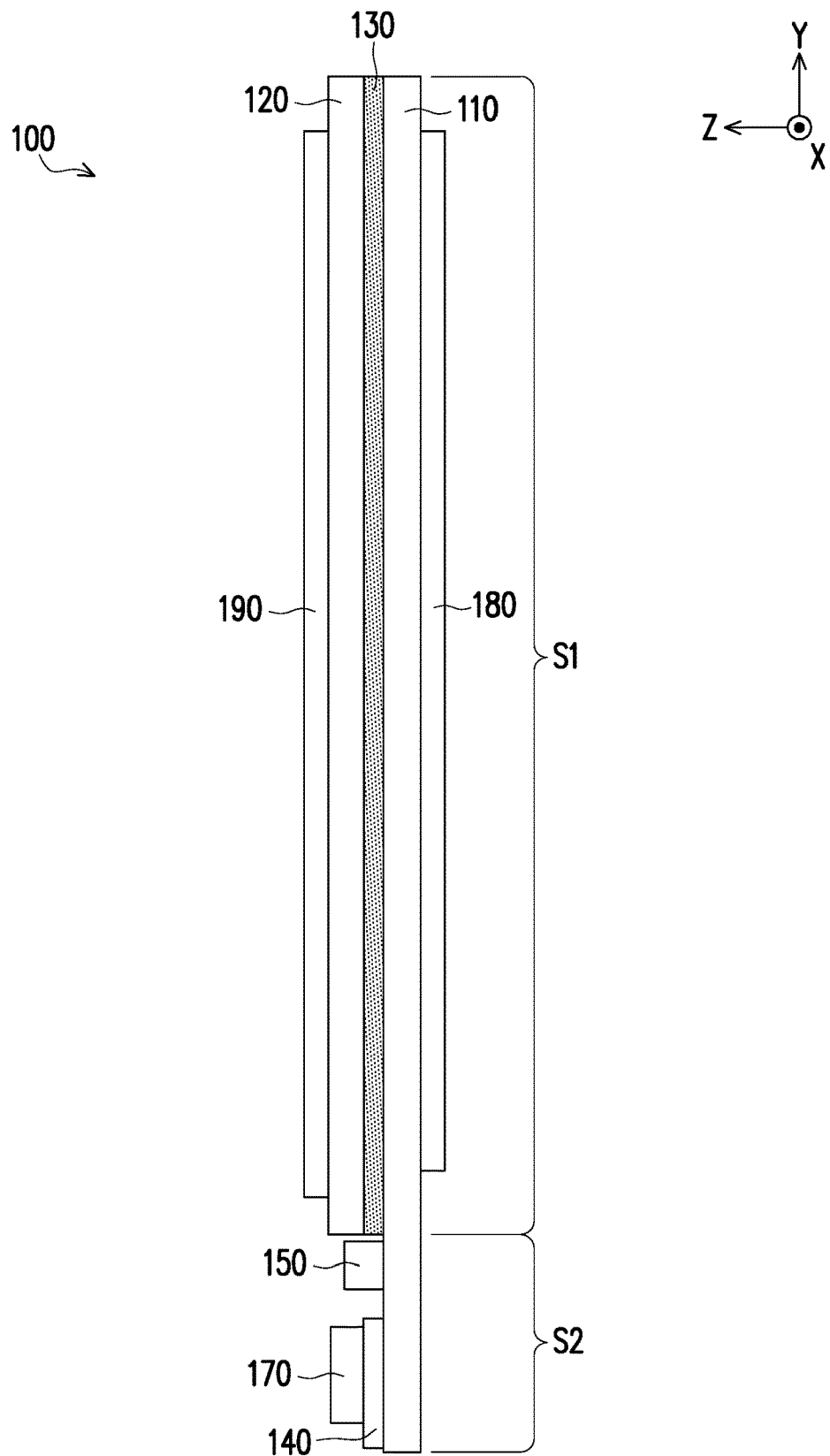
FIG. 2 is a schematic side view of a display in FIG. 1.

FIG. 1 is a schematic top view of an electronic device according to the invention. FIG. 2 is a schematic side view of a display in FIG. 1. Referring to FIG. 1 and FIG. 2 simultaneously, in the embodiment, the electronic device 10 includes a display 100 and a system host 200, where the system host 200 is pivotally connected to the display 100 and electrically connected to the display 100. Here, the electronic device 10 is, for example, a notebook computer, but is not limited thereto. In other embodiments not shown, the electronic device may also be a mobile phone, a tablet or a display screen or the like.

In detail, the display 100 of the embodiment includes a first substrate 110, a second substrate 120, a display medium layer 130, and a flexible printed circuit board 140. The first substrate 110 is an active component array substrate such as a thin film transistor array substrate, and the first substrate 110 has a first region S1 and a second region S2. The second substrate 120 is disposed opposite to the first substrate 110 and faces the first region S1 of the first substrate 110, where the second region S2 of the first substrate 110 is a region of the first substrate 110 extending beyond the second substrate 120. Here, in the first region S1 of the first substrate 110, a region in which the first substrate 110 and the second substrate 120 completely overlap includes a display region, and the second region S2 extending from the first region S1 beyond the second substrate 120 may be regarded as a peripheral circuit configuration region. The display medium layer 130 is disposed between the first substrate 110 and the second substrate 120 and located in the first region S1 of the first substrate 110. The display medium layer 130 is, for example, a liquid crystal display layer, but is not limited thereto. It should be noted that, in the embodiment, the second substrate 120 is embodied as a color filter substrate, but is not limited thereto. In other embodiments not shown, a color filter layer may also be integrated in the first substrate, that is, the second substrate does not include the color filter layer, and is only an opposite substrate, which is still within the scope of protection of the invention.

In particular, the flexible printed circuit board 140 of the embodiment is disposed in the second region S2 of the first substrate 110, where the first substrate 110 is electrically connected to the flexible printed circuit board 140, and an orthographic projection of the flexible printed circuit board 140 on the first substrate 110 is located within the range of the first substrate 110. That is to say, the flexible printed circuit board 140 is completely disposed in the second region S2 of the first substrate 110.

Furthermore, the display 100 of the embodiment further includes a plurality of driving components 150, where the driving components 150 are disposed in the second region S2 of the first substrate 110, and the driving components 150 are located between the first region S1 of the first substrate 110 and the flexible printed circuit board 140. As shown in FIG. 2, the driving components 150, the flexible printed circuit board 140 and the second substrate 120 of the embodiment are located on the same side of the first substrate 110. Here, referring again to FIG. 1, the driving components 150 include at least one source driver integrated circuit 152 (three source driver integrated circuits are schematically shown in FIG. 1) and a source integrated timing controller 154, where the source integrated timing controller 154 is to integrate a source driver integrated circuit and a timing controller, which can ensure that the overall actuation logic is identical to the original logic and can effectively save space configuration.

Further, the display 100 of the embodiment further includes a gamma corrector 160, where the gamma corrector 160 is disposed on the flexible printed circuit board 140 and electrically connected to the flexible printed circuit board 140. In addition, the display 100 may further include a connector 170, where the connector 170 is disposed on the flexible printed circuit board 140, and the flexible printed circuit board 140 is electrically connected to the system host 200 through the connector 170. As shown in FIG. 1, in conjunction with coordinate axes in FIG. 1, in order to reduce the length of the flexible printed circuit board 140 in a Y direction, a power management integrated circuit 210 and a light emitting diode driver 220 may be disposed on the system host 200, where a power supply (not shown) and a light emitting diode (not shown) disposed on the active component array substrate 110 may be driven by the power management integrated circuit 210 and the light emitting diode driver 220 through the connector 170 disposed on the flexible printed circuit board 140.

The orthographic projection of the flexible printed circuit board 140 of the embodiment on the first substrate 110 is within the range of the first substrate 110, the gamma corrector 160 and the connector 170 are disposed on the flexible printed circuit board 140, and the timing controller, the power management integrated circuit 210 and the light emitting diode driver 220 disposed on the printed circuit board in the architecture of the prior art are moved to a region other than the flexible printed circuit board 140. Therefore, the flexible printed circuit board 140 of the embodiment may replace the printed circuit board in the prior art. Further, in terms of structural design, the thickness of a general printed circuit board (i.e. the thickness of a six-layer board) is 0.8 mm, the thickness of the first substrate 110 is, for example, 0.2 mm, and the thickness of the flexible printed circuit board 140 (i.e. the thickness of a two-layer board) is less than 0.15 mm. That is, in the architecture of the prior art, the scenario where the printed circuit board and the second substrate 120 are located on the same side of the first substrate 110 is taken as an example, the sum of the thickness 0.8 mm of the printed circuit board and the thickness 0.15 mm of the flexible printed circuit board in the prior art which is bridged between the first substrate 110 and the printed circuit board is about 0.95 mm. In the architecture of the embodiment, the printed circuit board having a thickness of 0.8 mm is omitted, and only the flexible printed circuit board 140 having a thickness of, for example, 0.15 mm is used, thus reducing the thickness by 0.8 mm in contrast. Even if the architecture of the prior art in which the printed circuit board and the second substrate 120 are located on different sides of the first substrate 110 is taken as an example, the overall structure thickness of the embodiment is smaller than the overall thickness of the architecture of the prior art. On the other hand, referring to the coordinate axes in FIG. 1 and FIG. 2, in terms of space uses, in a Z direction, the display 100 of the embodiment has only the thickness of the flexible printed circuit board 140 and the thickness of electronic components (the gamma corrector 160 and the connector 170), and does not have the thickness of the printed circuit board. In addition, since the embodiment does not require the length of the flexible printed circuit board in the prior art which is bridged between the first substrate 110 and the printed circuit board in the Y direction, and the flexible printed circuit board 140 does not need to accommodate the timing controller, the power management integrated circuit 210 and the light emitting diode driver 220 and can control the length in the Y direction. Thus, the sizes in the Y direction and the Z direction can be effectively reduced as a whole, and the trend of reducing the overall size of the display 100 is met. Further, in terms of cost, the replacement of the printed circuit board in the prior art with the flexible printed circuit board 140 can at least reduce the cost caused by the difference between the thickness in the Z direction and the length in the Y direction. In addition, since the embodiment eliminates the use of the printed circuit board in the prior art and the flexible printed circuit board 140 is directly bonded to the first substrate 110, the man-hour for bonding the flexible printed circuit board to the printed circuit board can be saved.

In addition, referring again to FIG. 2, the display 100 of the embodiment further includes a first polarizer 180 and a second polarizer 190. The first substrate 110 is disposed between the first polarizer 180 and the display medium layer 130, and the first polarizer 180 is located in the first region S1 of the first substrate 110. The second substrate 120 is disposed between the second polarizer 190 and the display medium layer 130, and the second polarizer 190 is disposed corresponding to the first polarizer 180. Here, in the first region S1 of the first substrate 110, a region in which the first substrate 110 and the second substrate 120, first polarizer 180 and the second polarizer 190 completely overlap is the display region.

Based on the above, the embodiments of the invention have at least one of the following advantages or effects. In the design of the display of the invention, the orthographic projection of the flexible printed circuit board on the first substrate is within the range of the first substrate. Compared with the prior art in which the flexible printed circuit board is only bridged between the active component array substrate and the printed circuit board, the flexible printed circuit board of the invention is different from the flexible printed circuit board in the prior art in setting, can replace the printed circuit board in the prior art, and has the advantages of reducing the weight of the display and reducing the thickness of the display. In addition, the electronic device using the display of the invention can conform to the trend of thinness, and has a lower manufacturing cost.

The foregoing description of the preferred embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to best explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to particularly preferred exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. The abstract of the disclosure is provided to comply with the rules requiring an abstract, which will allow a searcher to quickly ascertain the subject matter of the technical disclosure of any patent issued from this disclosure. It is submitted with the understanding that it will not be used to interpret or limit the scope or meaning of the claims. Any advantages and benefits described may not apply to all embodiments of the invention. It should be appreciated that variations may be made in the embodiments described by persons skilled in the art without departing from the scope of the invention as defined by the following claims. Moreover, no element and component in the disclosure is intended to be dedicated to the public regardless of whether the element or component is explicitly recited in the following claims.

What is claimed is:

1. A display, comprising a first substrate, a second substrate, a display medium layer, and a flexible printed circuit board, wherein the first substrate is an active component array substrate and comprises a first region and a second region;

the second substrate is disposed opposite to the first substrate and faces the first region of the first substrate, and the second region of the first substrate is a region of the first substrate extending beyond the second substrate;

the display medium layer is disposed between the first substrate and the second substrate and located in the first region of the first substrate; and the flexible printed circuit board is disposed in the second region of the first substrate, the first substrate is electrically connected to the flexible printed circuit board, and an orthographic projection of the flexible printed circuit board on the first substrate is completely located within a range of the first substrate.

2. The display according to claim 1, further comprising a plurality of driving components, wherein
the plurality of driving components are disposed in the second region of the first substrate, and the plurality of driving components are located between the first region of the first substrate and the flexible printed circuit board.

3. The display according to claim 2, wherein the plurality of driving components and the flexible printed circuit board are located on the same side of the first substrate.

4. The display according to claim 3, wherein the plurality of driving components, the flexible printed circuit board and the second substrate are located on the same side of the first substrate.

5. The display according to claim 2, wherein the plurality of driving components comprise at least one source driver integrated circuit and a source integrated timing controller.

6. The display according to claim 1, further comprising a gamma corrector, wherein
the gamma corrector is disposed on the flexible printed circuit board and electrically connected to the flexible printed circuit board.

7. The display according to claim 1, further comprising a connector, wherein
the connector is disposed on the flexible printed circuit board and electrically connected to the flexible printed circuit board.

8. The display according to claim 1, further comprising a first polarizer and a second polarizer, wherein
the first substrate is disposed between the first polarizer and the display medium layer, and the first polarizer is located in the first region of the first substrate; and
the second substrate is disposed between the second polarizer and the display medium layer, and the second polarizer is disposed corresponding to the first polarizer.

9. The display according to claim 1, wherein the first substrate is a thin film transistor array substrate.

10. An electronic device, comprising a display and a system host, wherein
the display comprises a first substrate, a second substrate, a display medium layer, and a flexible printed circuit board, wherein
the first substrate is an active component array substrate and comprises a first region and a second region;
the second substrate is disposed opposite to the first substrate and faces the first region of the first substrate, and the second region of the first substrate is a region of the first substrate extending beyond the second substrate;

the display medium layer is disposed between the first substrate and the second substrate and located in the first region of the first substrate;

the flexible printed circuit board is disposed in the second region of the first substrate, the first substrate is electrically connected to the flexible printed circuit board, and an orthographic projection of the flexible printed circuit board on the first substrate is completely located within a range of the first substrate; and the system host is pivotally connected to the display, and electrically connected to the display.

11. The electronic device according to claim 10, wherein the display further comprises a plurality of driving components, wherein
the plurality of driving components are disposed in the second region of the first substrate, and the plurality of driving components are located between the first region of the first substrate and the flexible printed circuit board.

12. The electronic device according to claim 11, wherein the plurality of driving components and the flexible printed circuit board are located on the same side of the first substrate.

13. The electronic device according to claim 12, wherein the plurality of driving components, the flexible printed circuit board and the second substrate are located on the same side of the first substrate.

14. The electronic device according to claim 11, wherein the plurality of driving components comprise at least one source driver integrated circuit and a source integrated timing controller.

15. The electronic device according to claim 10, wherein the display further comprises a gamma corrector, wherein
the gamma corrector is disposed on the flexible printed circuit board and electrically connected to the flexible printed circuit board.

16. The electronic device according to claim 10, wherein the display further comprises a connector, wherein
the connector is disposed on the flexible printed circuit board, and the flexible printed circuit board is electrically connected to the system host through the connector.

17. The electronic device according to claim 10, wherein the display further comprises a first polarizer and a second polarizer, wherein
the first substrate is disposed between the first polarizer and the display medium layer, and the first polarizer is located in the first region of the first substrate; and
the second substrate is disposed between the second polarizer and the display medium layer, and the second polarizer is disposed corresponding to the first polarizer.

18. The electronic device according to claim 10, wherein the first substrate is a thin film transistor array substrate.

* * * * *